United States Patent [19]
Lopez et al.

[11] Patent Number: 5,199,035
[45] Date of Patent: Mar. 30, 1993

[54] LOGIC CIRCUIT FOR RELIABILITY AND YIELD ENHANCEMENT

[75] Inventors: David E. Lopez; Tomas Colunga, both of Tempe, Ariz.

[73] Assignee: Motorola, Inc., Schaumburg, Ill.

[21] Appl. No.: 591,189

[22] Filed: Oct. 1, 1990

[51] Int. Cl.[5] .................. G06F 15/40; G06F 11/00
[52] U.S. Cl. ........................... 371/68.1; 371/50.1; 371/3; 371/22.5; 365/200
[58] Field of Search ............... 371/68.1, 50.1, 51.1, 371/21.2, 3, 21.1, 22.5; 365/200, 201

[56] References Cited

U.S. PATENT DOCUMENTS

| | | | |
|---|---|---|---|
| 3,958,110 | 5/1976 | Hong | 371/22.2 |
| 4,464,747 | 8/1984 | Groudan | 371/50.1 |
| 4,541,090 | 9/1985 | Shiragasawa | 371/21.2 |
| 4,878,220 | 10/1989 | Hashimoto | 371/3 X |
| 5,075,892 | 12/1991 | Choy | 371/68.1 X |
| 5,083,083 | 1/1992 | El-Ayat | 371/22.2 X |

*Primary Examiner*—Robert W. Beausoliel, Jr.
*Assistant Examiner*—Ly V. Hua
*Attorney, Agent, or Firm*—Bradley J. Botsch, Sr.

[57] ABSTRACT

A logic circuit for testing the reliability of an ASIC includes an array circuit having a plurality of matrix arrays each having a plurality of inputs. The plurality of matrix arrays being positioned in a predetermined row and column of the array circuit and being responsive to a plurality of input signals applied thereto for providing a respective row and column output. A parity circuit responsive to the row and column outputs of the plurality of matrix arrays for causing an output signal at an output of the logic circuit to be in a first logic state whenever the row outputs of the plurality of matrix arrays are logically different, or whenever the column outputs of the plurality of matrix arrays are logically different. A stimulus circuit coupled to the plurality of inputs of the plurality of matrix arrays for supplying the plurality of input signals to exhaustively stimulate each one of the plurality of matrix arrays with all possible logic combinations. A verification circuit for verifying the operation of the parity circuit by stimulating the parity circuit with a predetermined logic sequence. The reliability and functionality of the ASIC can be determined by observing a frequency of the output signal supplied at the output of the logic circuit wherein the frequency of the output signal is a function of the number of defects occurring within the array circuit and the parity circuit.

6 Claims, 3 Drawing Sheets

LOGIC CIRCUIT FOR RELIABILITY AND YIELD ENHANCEMENT

BACKGROUND OF THE INVENTION

This invention relates to logic circuits and, in particular, to logic circuits for ASIC reliability and yield enhancement.

Application Specific Integrated Circuits (ASIC) typically include gate arrays and standard cells which can be implemented in a plurality of technologies, for example, CMOS, bipolar or BiMOS technology. Gate arrays are typically pre-processed wafers in which familiar standard logic functions can be implemented, for example, an AND function. One advantage of gate arrays is that they provide increased silicon efficiency and consequently higher logic densities and lower costs than previously used large scale integrated circuit design methodologies.

Standard cells comprise various blocks for providing a library of functions ranging form primitive functions such as AND or OR gates to more complex functions such as random access memory (RAM). Typically one designs an standard cell chip by placing and interconnecting blocks wherein each block performs a predetermined function from the library.

As ASIC's grow in size and complexity, it is becoming more important to adequately test an ASIC for reliability and yield. Developing a suitable "test vehicle" to completely test an ASIC for reliability is not an easy task since each individual gate/cell on the ASIC must be tested for functionality. The "test vehicle" becomes even more complex when performing burn-in testing. Burn-in testing is when a sample of ASIC's are powered up for a predetermined period of time and, subsequently tested for reliability and functionality after the predetermined burn-in time. Further, adequate burn-in testing can typically involve repeated testing for a number of predetermined periods. However, the idea behind burn-in testing is that most, if not all, failures will be detected. However, as aforementioned, burn-in testing typically requires one to repeatedly measure the functionality of the ASIC's after a number of predetermined burn-in time periods. This procedure can be quite expensive and even unfeasible.

Hence, a need exists for a novel logic circuit for testing the reliability and yield enhancement for ASIC's.

SUMMARY OF THE INVENTION

Accordingly, it is an object of the present invention to provide and improved logic circuit for ASIC reliability and yield enhancement.

Another object of the present invention is to provide a logic circuit to continuously monitor failures for an ASIC by observing the frequency of an output.

Yet another object of the present invention is to provide an improved logic circuit to continuously monitor failures of an ASIC during burn-in testing.

In carrying out the above and other objects of the present invention, there is provided a logic circuit comprising an array circuit including a plurality of matrix arrays each having a plurality of inputs, the plurality of matrix arrays being positioned in a predetermined row and column of the array circuit and being responsive to a plurality of input signals applied thereto for providing a respective row and column output; a parity circuit responsive to the row and column outputs of the plurality of matrix arrays for causing an output signal at an output of the logic circuit to be in a first logic state whenever the row outputs of the plurality of matrix arrays are logically different, or whenever the column outputs of the plurality of matrix arrays are logically different; and a stimulus circuit coupled to the plurality of inputs of the plurality of matrix arrays for supplying the plurality of input signals to exhaustively stimulate each one of the plurality of matrix arrays with all possible logic combinations.

The above and other object, features and advantages of the present invention will be better understood from the following detailed description taken in conjunction with the accompanying drawings.

DETAILED DESCRIPTION OF THE INVENTION

Figure 1:
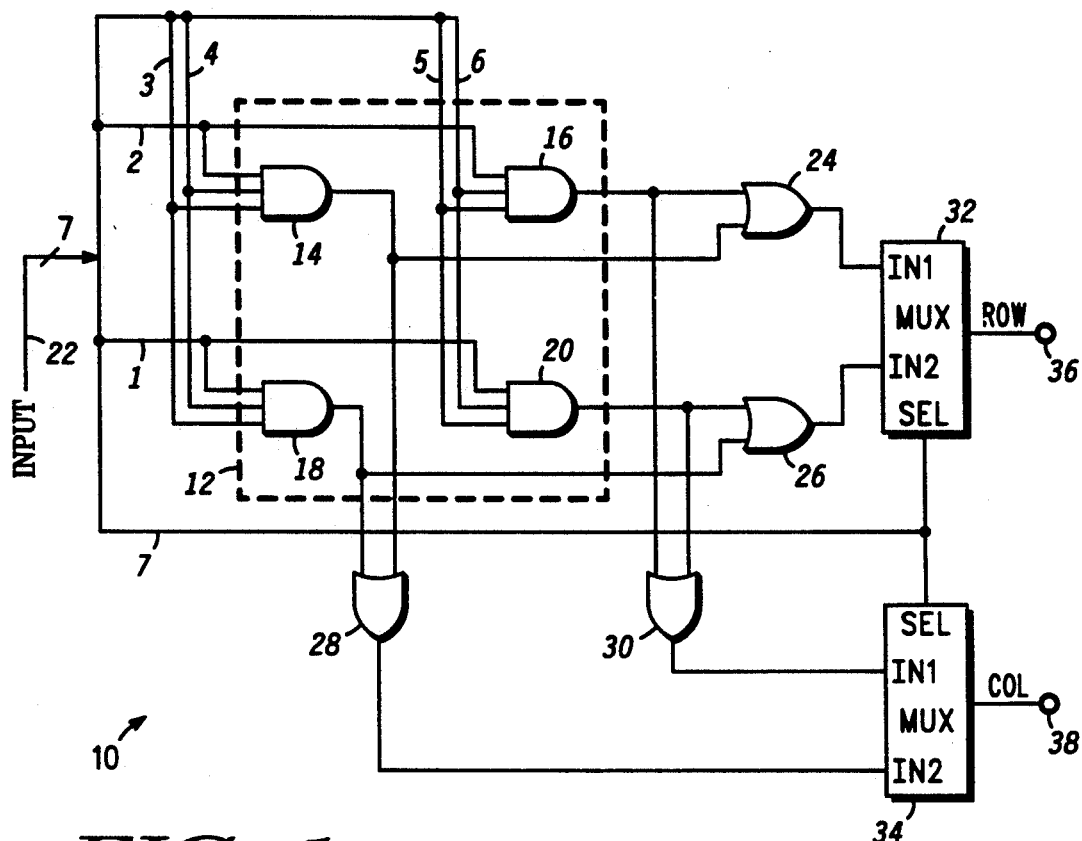
FIG. 1 is a schematic diagram illustrating a logic circuit for exhaustively verifying the functionality of a 2×2 matrix array.

Referring to FIG. 1, a partial schematic diagram illustrating logic circuit 10 for exhaustively verifying the functionality of 2×2 matrix array 12 is shown. Matrix array 12 comprises a plurality of 3-input AND gates, 14, 16, 18 and 20 whereby the AND gates are configured in a row-column matrix array. For example, AND gate 16 is located in row 1, column 2. At least one object of logic circuit 10 is to exhaustively stimulate each input of the 3-input AND gates in matrix array 12 while observing their respective outputs. The first, second and third inputs of AND gate 14 are coupled to bus 22 for receiving logic signals 2, 4 and 3, respectively. The first, second and third inputs of AND gate 18 are also coupled to bus 22 for receiving logic signals 1, 4 and 3, respectively. The first, second and third inputs of AND gate 16 are coupled to bus 22 for receiving logic signals 2, 6 and 5, respectively. The first, second and third inputs of AND gate 20 are coupled to bus 22 for receiving logic signals 1, 6 and 5, respectively. The outputs of the row one AND gates 14 and 16 are respectively coupled to first and second inputs of row one OR gate 24, while the outputs of the row 2 AND gates 18 and 20 are respectively coupled to first and second inputs of row two OR gate 26. Likewise, the outputs of the column 1 AND gates 14 and 18 are respectively coupled to first and second inputs of column one OR gate 28, while the outputs of the column 2 AND gates 16 and 20 are respectively coupled to first and second inputs of column two OR gate 30. The outputs of OR gates 24 and 26 are respectively coupled to IN1 and IN2 inputs of multiplexer 32. Similarly, the outputs of OR gates 28 and 30 are respectivly coupled to IN1 and IN2 inputs of multiplexer 34. The select inputs (SEL) of multiplexers 32 and 34 are coupled to bus 22 for receiving logic signal 7. The output of multiplexer 32 is coupled to ROW output terminal 36 while the output of multiplexer 34 is coupled to COL (column) output terminal 38.

In operation, AND gates 14, 16, 18 and 20 have each of their three inputs exhaustively stimulated by all possible logic combinations which is 8 ($2^3$) by a known input logic sequence via signals 1-6. The outputs of row AND gates 14 and 16 are observed at the output of OR gate 24, while the output of row 2 AND gates 18 and 20 are observed at the output of OR gate 26. Likewise, the outputs of column 1 AND gates 14 and 18 are observed at the output of OR gate 28, while the outputs of column 2 AND gates 16 and 20 are observed at the output of OR gate 30. Further, the outputs of row OR gates 24 and 26 are individually available at output terminal 36 depending upon the logic state appearing at the SEL input (via signal 7) of multiplexer 32, while the outputs of column OR gates 28 and 30 are individually available at output terminal 38 depending upon the logic state appearing at the SEL input (via signal 7) of multiplexer 34. At least one unique feature of logic circuit 10 is that by comparing the output logic signals at terminals 36 and 38 with known output logic signals that should result given a known input logic signal via signals 1-7, one can easily determine if a fault has occurred and where it has occurred. For example, suppose that AND gate 14 is defective such that at least one input logic combination via signals 2-4 (for this AND gate) does not produce the known logic output at the output of AND gate 14. Therefore, the output of row one OR gate 24 (and also ROW output terminal 36) and column one OR gate 28 (and also COL output terminal 38) would reveal a fault when compared with the known desired output. This would not only reveal that a fault has occurred, but since the output of row one OR gate 24 and the output of column one OR gate 28 are in error, the fault can be specifically traced back to AND gate 14 since it is in row one, column one of matrix array 12. It is important to realize that logic circuit 10 provides a method to exhaustively stimulate all inputs of the 3-input AND gates in matrix array 12, and to determine if a failure has occurred and where it has occurred by simply observing the ROW and COL output terminals 36 and 38, given a known input stimulus. It is also worth noting that matrix array 12 can be easily expanded to any size array whereby the expanded matrix array can also be tested for reliability and failures by utilizing an OR gate for each row of the matrix array, and an OR gate for each column of the matrix array (as is done for matrix array 12). Furthermore, the size of multiplexers 32 and 34 would need to be increased to respectively select between each individual row OR gate outputs and each individual column OR gate output. For example, let's assume that we have a 16×16 expanded matrix array. This would require 16 16-input row OR gates, and 16 16-input column OR gates. Further, Multiplexers 32 and 34 would need to be 16:1 rather than 2:1 as shown in FIG. 1. However, it must be realized that regardless of the size of matrix array 12, only one row output terminal and one column output terminal needs to be observed. It is also worth noting that AND gates 14, 16, 18 and 20 are shown for convenience as having only three inputs, but are not to be restricted to having only three inputs. In addition, gates 14, 16, 18 and 20 should not even be restricted to being AND gates.

Figure 2:
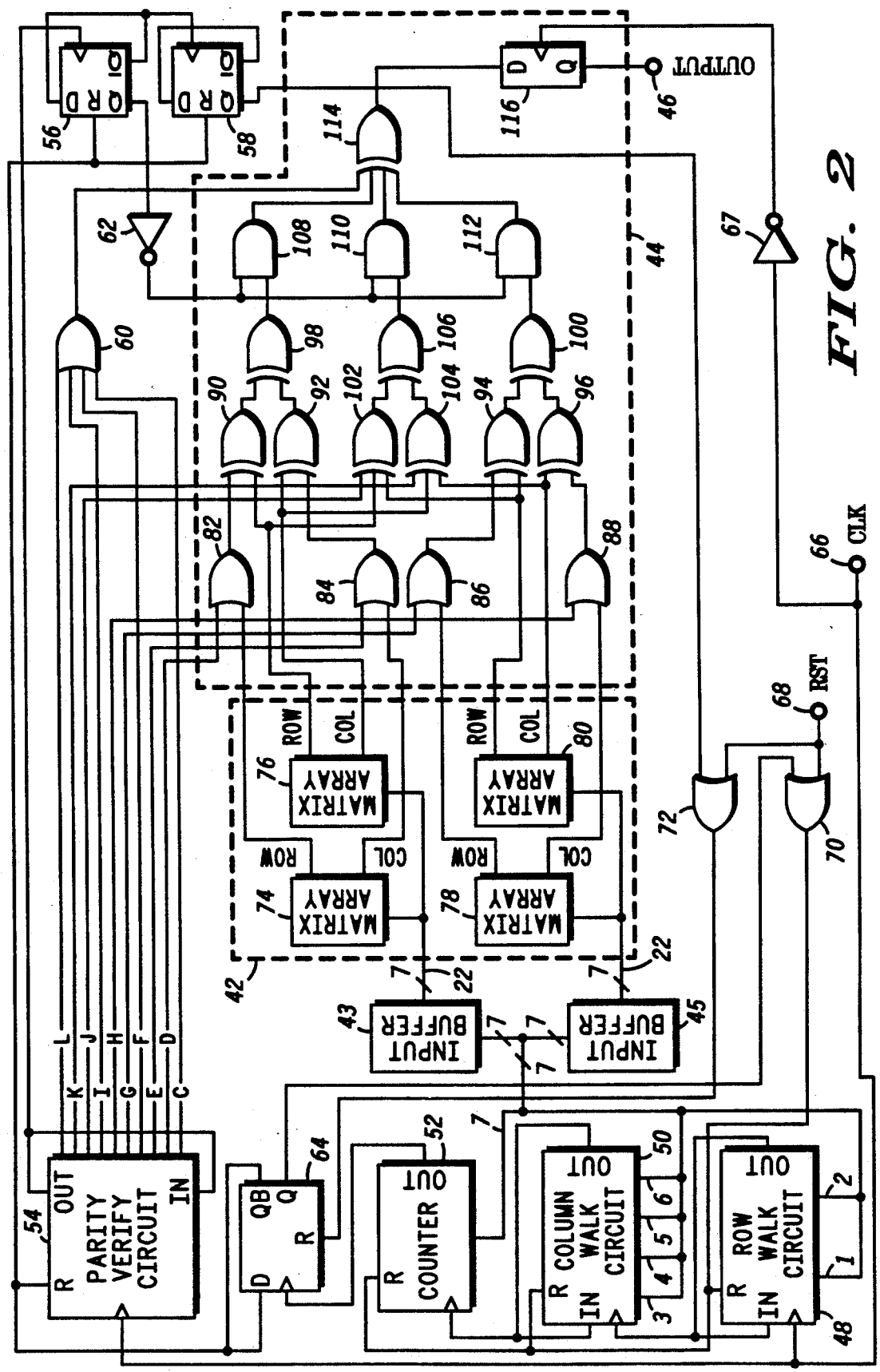
FIG. 2 is a partial schematic diagram illustrating the logic circuit of the present invention.

Referring to FIG. 2, a partial schematic diagram illustrating the logic circuit of the present invention is shown comprising array 42 having a plurality of inputs coupled to bus 22 and a plurality of outputs respectively coupled to a plurality of inputs of parity circuit 44. Parity circuit 44 also has an output coupled to output terminal 46. ROW WALK CIRCUIT 48 and COLUMN WALK CIRCUIT 50 along with COUNTER 52 provide signals 1-7 to array 42 via INPUT BUFFERS 43 and 45 wherein INPUT BUFFERS 43 and 45 are bi-directional. In particular, the first and second outputs of ROW WALK CIRCUIT 48 provide logic signals 1 and 2 to array 42 via INPUT BUFFERS 43 and 45. Further, the first, second, third and fourth outputs of COLUMN WALK CIRCUIT 50 provide logic signals 3-6 to array 42 via INPUT BUFFERS 43 and 45. Finally, the first output of COUNTER 52 provides logic signal 7 to array 42 via INPUT BUFFERS 43 and 45. PARITY VERIFY CIRCUIT 54 along with D flip flops 56 and 58, OR gate 60 and inverter 62 are provided to verify the proper operation of parity circuit 44. Further, D flip flop 64 allows for switching between testing array 42 via ROW WALK CIRCUIT 48, COLUMN WALK CIRCUIT 50 and COUNTER 52 and the testing of parity circuit 44 via PARITY VERIFY CIRCUIT 54, D flip flops 56 and 58, OR gate 60 and inverter 62. A logic clock signal (CLK) is typically applied to terminal 66 which is used to clock ROW WALK CIRCUIT 48 and PARITY VERIFY CIRCUIT 54, while the inversion of signal CLK via inverter 67 is used to clock parity circuit 44. The required oscillator needed for the generation of signal CLK can be incorporated on the same integrated circuit with all the other circuitry or it can be external. A logic reset signal (RST) is typically applied to terminal 68 which is coupled to the first inputs of OR gates 70 and 72. The second input of OR gate 70 is coupled to a non inverting output of D flip flop 64, while the second input of OR gate 72 is coupled to a non-inverting output of D flip flop 58. The output of OR gate 70 is coupled to the reset inputs (R) of ROW WALK CIRCUIT 48, COLUMN WALK CIRCUIT 50, and COUNTER 52. Also, the output of OR gate 72 is coupled to the reset input (R) of D flip flop 64. A third output (OUT) of ROW WALK CIRCUIT 48 is coupled to the clock input of COLUMN WALK CIRCUIT 50 and also to a first input (IN) of ROW WALK CIRCUIT 48. A fifth output (OUT) of COLUMN WALK CIRCUIT 50 is coupled to the clock input of COUNTER 52 and back to a first input (IN) of COLUMN WALK CIRCUIT 50. A second output (OUT) of COUNTER 52 is coupled to the clock input of D flip flop 64. The inverting output of D flip flop 64 is coupled to the data (D) input of D flip flop 64 and to the reset inputs (R) of PARITY VERIFY CIRCUIT 54 and D flip flops 56 and 58. PARITY VERIFY CIRCUIT 54 provides a plurality of outputs labeled C, D, E, F, G, H, I, J, K and L. Outputs C, F, I and L are coupled to the inputs of OR gate 60 whose output is coupled to parity circuit 44. An inverting output (OUT) of PARITY VERIFY CIRCUIT 54 is coupled back to the input (IN) of PARITY VERIFY CIRCUIT 54 and to the clock input of D flip flop 56. An inverting output of D flip flop 56 is coupled to the clock input of D flip flop 58 and back to the data input of D flip flop 56. The non-inverting output of D flip flop 56 is coupled to an input of inverter 62, the latter having an output coupled to parity circuit 44. An inverting output of D flip flop 58 is coupled to the data input of D flip flop 58.

Array 42 includes matrix arrays 74, 76, 78 and 80 which are all configured identical to logic circuit 10 of FIG. 1. Therefore, matrix arrays 74, 76, 78 and 80 can be configured as 2×2 arrays but are not limited to this configuration as aforementioned. The plurality of inputs of matrix arrays 74 and 76 are coupled to a plurality of outputs of INPUT BUFFER 43, the latter having a plurality of inputs for receiving signals 1-7 from bus 22. Similarly, the plurality of inputs of matrix arrays 78 and 80 are coupled to a plurality of outputs of INPUT BUFFER 45, the latter having a plurality of inputs for receiving signals 1-7 from bus 22. Each matrix array also provides both a row and a column output which together provide the plurality of outputs (eight) of array 42. It must be realized that matrix arrays 74, 76, 78 and 80 are all identical such that if they are all stimulated by the same input logic sequence from bus 22 via INPUT BUFFERS 43 and 45, their respective output logic sequences will be identical provided that each gate of matrix arrays 74, 76, 78 and 80, each INPUT BUFFER 43 and 45, and OR gates (24, 26, 28 and 30) as well as multiplexers (32 and 34) are all operating properly.

Parity circuit 44 comprises OR gate 82 having a first input coupled to output D of PARITY VERIFY CIRCUIT 54 and a second input coupled to the row output of matrix array 74. OR gate 84 has a first input coupled to the column output of matrix array 74 and a second input coupled to output E of PARITY VERIFY CIRCUIT 54. OR gate 86 has a first input coupled to the row output of matrix array 78 and a second input coupled to output G of PARITY VERIFY CIRCUIT 54. OR gate 88 has a first input coupled to the column output of matrix array 78 and a second input coupled to output H of PARITY VERIFY CIRCUIT 54. The output of OR gate 82 and the row output of matrix array 76 are coupled to inputs of exclusive OR (XOR) gate 90. The first input of XOR gate 92 is coupled to the column output of matrix array 76 while the second input of XOR gate 92 is coupled to the output of OR gate 84. The first input of XOR gate 94 is coupled to the output of OR gate 86 while the second input of XOR gate 94 is coupled to the output of matrix array 80. The first input of XOR gate 96 is coupled to the column output of matrix array 80 while the second input of XOR gate 96 is coupled to the output of OR gate 88. The outputs of XOR gates 90 and 92 are coupled to the inputs of XOR gate 98, while the outputs of XOR gates 94 and 96 coupled to the inputs of XOR gate 100. XOR gate 102 has a first input coupled to output J of PARITY VERIFY CIRCUIT 54, a second input coupled to the row output of matrix arrays 76, and a third input coupled to the row output of matrix array 80. XOR gate 104 has a first input coupled to the column output of matrix array 76, a second input coupled to the column output of matrix array 80 and a third input coupled to output K of PARITY VERIFY CIRCUIT 54. The outputs of XOR gates 102 and 104 are coupled to the inputs of XOR gate 106. The first inputs of AND gates 108, 110 and 112 are respectively coupled to the outputs of XOR gates 98, 106 and 100. Also, the second inputs of AND gates 108, 110 and 112 are all coupled to the output of inverter 62. The outputs of AND gates 108, 110 and 112 as well as the output of OR gate 60 are all coupled to inputs of XOR gate 114. The output of XOR gate 114 is coupled to the data (D) input of D flip flop 116, the latter having a clock input coupled to terminal 66. An output of D flip flop 116 is coupled to output terminal 46.

In operation, assume that the logic circuit has just been reset and all the outputs of ROW WALK CIRCUIT 48, COLUMN WALK CIRCUIT 50, COUNTER 52, PARITY VERIFY CIRCUIT 54 and D flip flops 56 and 58 are at a logic low. Thus, the inverting output of D flip flop 64 is a logic high which functions to reset PARITY VERIFY CIRCUIT 54 thereby providing a logic low at each output thereof. Thus, counter 64 function as a mode controller such that when the logic circuit is in a first mode of operation, PARITY VERIFY CIRCUIT 54 as well as D flip flops 56 and 58 are reset. Further, assuming that signal RST applied at terminal 68 has now returned to a logic low, the non-inverting output of counter 64 is also a logic low such that ROW WALK CIRCUIT 48, COLUMN WALK CIRCUIT 50, and COUNTER 52 are not held to reset. Therefore, ROW WALK CIRCUIT 48, COLUMN WALK CIRCUIT 50, and COUNTER 52 essentially include a plurality of D flip flops coupled together to exhaustively stimulate the inputs of array 42 with all possible logic combinations such that each gate of matrix arrays 74, 76, 78 and 80 are exhaustively stimulated. The specific details of the operation of ROW WALK CIRCUIT 48, COLUMN WALK CIRCUIT 50, and COUNTER 52 will be discussed later.

It must be understood that matrix arrays 74, 76, 78 and 80 are all simultaneously stimulated with the same set of logic signals (1-7). Furthermore, the structure of matrix arrays 74, 76, 78 and 80 are identical and similar to the configuration of logic circuit 10 of FIG. 1. Therefore, for identical input signals, the row and column outputs of matrix array 74 should be identical to the respective row and column outputs of matrix arrays 76, 78 and 80 (assuming proper operation. For example, the row output of matrix array 74 is exclusive OR'ed with the row output of matrix array 76 by XOR gate 90. If for as few as one clock cycle which would correspond to one set of input logic conditions occurring on signals 1-7, the row output from matrix array 74 differs in logic state from the row output of matrix array 76, the output of XOR gate 90 will be a logical high. Since the logic circuit is operating in the first mode, the output of D flip flop 56 is a logic low and the logical high appearing at the output of XOR gate 90 will propagate through XOR gate 98, AND gate 108 and XOR gate 114 to provide a logical high pulse at the output of D flip flop 116 and consequently at output terminal 46. Thus, it is important to realize for this example that if for at least one clock cycle, the row output of matrix array 74 differs in logic states from the row output of matrix array 76, or the column output of matrix array 74 differs in logic states from the column output of matrix array 76, a fault has occurred within matrix array 74 or 76, and it is detectable by the logical high appearing at output terminal 46. Further, it should be realized that XOR gates 90, 92 and 98 function as a parity tree circuit such that if a logical high appears at one of the inputs of XOR gates 90 or 92, the logical high will propagate to the output of XOR gate 98. This is true under the assumption that all logic lows appear at all of the other inputs of XOR gates 90 and 92. Further, this parity tree circuit is configured to detect any failures occurring in the first row of array 42, in particular, any failures within matrix arrays 74 and 76.

Likewise, XOR gates 94, 96 and 100 function as a parity tree circuit to detect failures occurring in the second row of array 42 such that if a logical high appears at an one of the inputs of XOR gates 94 or 96, the logical high will propagate to the output of XOR gate 100. This is again true under the assumption that all logic lows appear at all of the other inputs of XOR gates 94 and 96. XOR gate 96 compares the column outputs of matrix array 78 and matrix array 80, while XOR gate 94 compares the row outputs of matrix array 78 and 80. Likewise, it is important to realize that if for at least one clock cycle the row output of matrix array 78 differs in logic states from the row output of matrix array 80, or the column output of matrix array 78 differs in logic states from the column output of matrix array 80, a fault has occurred within matrix array 78 or 80, and it is detectable by the logical high appearing at output terminal 46.

Finally, and similar to the above parity tree circuits, XOR gates 102, 104 and 106 function as a parity tree circuit such that if a logical high appears at an one of the inputs of XOR gates 102 or 104, the logical high will propagate to the output of XOR gate 106. This is again true under the assumption that all zeroes appear at all of the other inputs of XOR gates 102 and 104. Further, this parity tree circuit is configured to detect any failures occurring in INPUT BUFFERS 43 and 45, and in particular, any "stuck low" or "stuck high" failures. XOR gate 102 compares the row outputs of matrix arrays 76 and 80, while XOR gate 104 compares the column outputs of matrix array 76 and 80. If one of the buffers of INPUT BUFFERS 43 and 45 is stuck high or low or otherwise inoperative, the row outputs of matrix arrays 74 and 76 and the column outputs of matrix arrays 74 and 76 will still be identical assuming that there are no errors within matrix arrays 74 and 76. Likewise, the row outputs of matrix arrays 78 and 80 as well as the column outputs of matrix arrays 78 and 80 will also be identical. However, XOR gate 102 compares the row output of matrix array 76 which receives signals 1-7 via INPUT BUFFER 43 with the row output of matrix array 80 which receives signals 1-7 via INPUT BUFFERS 45. Therefore, if one of the buffers is inoperative, the inputs to XOR gate 102 will typically not match for a plurality of clock pulses and the output of XOR gate 102 will provide a logic high pulse for each mismatch. Likewise, XOR gate 104 compares the column output of matrix array 76 which receives signals 1-7 via INPUT BUFFER 43 with the column output of matrix array 80 which receives signals 1-via INPUT BUFFERS 45. Therefore, if one of the buffers is inoperative, the inputs to XOR gate 104 will typically not match for a plurality of clock pulses and the output of XOR gate 102 will provide a logic high pulse for each mismatch. This logic high pulse will propagate through XOR gate 106, AND gate 110 and XOR gate 114 and provide a logic high pulse to the D input of D flip flop 116 which will subsequently provide a logic high pulse at output terminal 46. Therefore, it should be understood that a faulty buffer of INPUT BUFFERS 43 and 45 will provide a logic high pulse at output terminal 46, thereby signifying that a fault has occurred and has been detected.

It should be realized that while the logic circuit is in the first mode of operation, array 42 as well as INPUT BUFFERS 43 and 45 are exhaustively stimulated and verified for functionality. Further, for each defect occurring thereof, output 46 will provide a logic high pulse for each clock pulse. However, if any portion of parity circuit 44 is defective, the results obtained during the first mode will be inaccurate. Therefore, once ROW WALK CIRCUIT 48, COLUMN WALK CIRCUIT 50, and COUNTER 52 have completed their cycle of exhaustively verifying the functionality of array 42, the output (OUT) of COUNTER 52 switches to a logic high and clocks D flip flop 64. The clocking of D flip flop 64 now provides a logical high and a logical low respectively at the non-inverting and inverting outputs thereof. The logical high at the non-inverting output of D flip flop 64 functions to reset ROW WALK CIRCUIT 48, COLUMN WALK CIRCUIT 50, and COUNTER 52 via OR gate 70, while the logical low at the inverting output of D flip flop 64 functions to take PARITY VERIFY CIRCUIT 54 as well as D flip flops 56 and 58 out of reset. The clocking of D flip flop 64 as described above is now indicative of the logic circuit entering a second mode of operation whereby the functionality of parity circuit 44 is tested.

Figure 3:
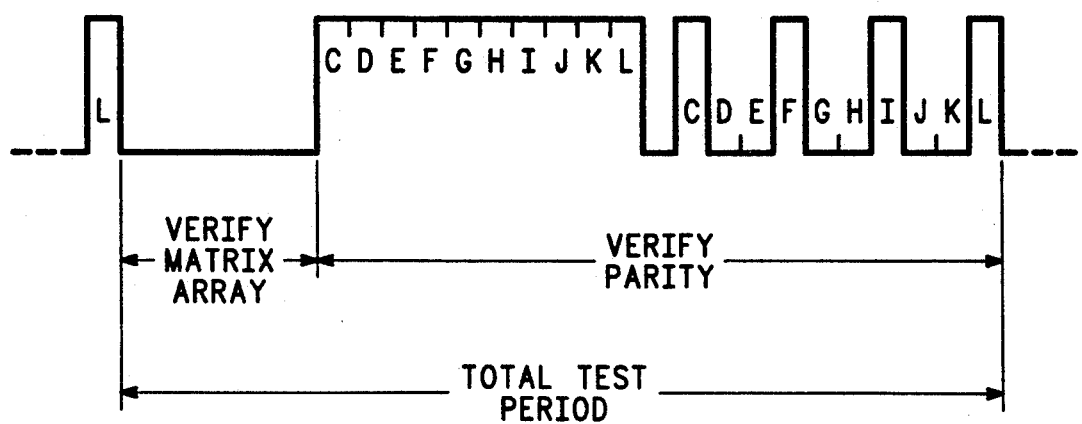
FIG. 3 is a typical graphical representation of the characteristic wave form provided at the output of the logic circuit of the present invention.

During the second mode of operation, PARITY VERIFY CIRCUIT 54 functions to "walk" a logic "1" which is present at the input of PARITY VERIFY CIRCUIT 54 through a field of logic "0"s presently appear at outputs C-L such that after a first clock pulse occuring since PARITY VERIFY CIRCUIT 54 was taken out of reset, output C switches to a logic high. Further, after a second clock pulse, output D switches to a logic high. It should be realized that at this time output C returns to a logic low. This continues up to a tenth clock pulse where output L switches to a logic high. The specific details of the operation of PARITY VERIFY CIRCUIT 54, which essentially includes a plurality of D flip flops, will be discussed later. Each of these logic highs appearing at outputs C-L will be transferred to output 46. In particular, the logic highs appearing at outputs C, F, I and L appear at output terminal 46 via OR gate 60, XOR gate 114 and D flip flop 116. The logic highs appearing at outputs D or E are respectively transferred to output 46 via OR gates 82 or 84 followed by the parity tree circuit comprising XOR gates 90, 92 and 98, AND gate 108, XOR gate 114 and D flip flop 116. Likewise, the logic highs appearing at outputs G or H are respectively transferred to output 46 via OR gates 86 or 88 followed by the parity tree circuit comprising XOR gates 94, 96 and 100, AND gate 112, XOR gate 114 and D flip flop 116. Furthermore, the logic highs appearing at outputs J or K are transferred to output 46 via the parity tree circuit comprising XOR gates 102, 104 and 106, AND gate 110, XOR gate 114 and D flip flop 116. Note that for the first ten clock pulses, the non-inverting output of D flip flop 56 is a logic low thereby allowing AND gates 108, 110 and 112 to be responsive to logic highs respectively occurring at the outputs of XOR gates 98, 106 and 100. Further, assuming that all circuitry in parity circuit 44 is operating properly, this ten cycle pulse occurring at outputs C-L as shown in FIG. 3 will result, wherein FIG. 3 shows a typical graphical representation of the characteristic wave form provided at output 46.

However, after an eleventh clock pulse, the output (OUT) of PARITY VERIFY CIRCUIT 54 switches to a logic high and clocks D flip flop 56 which transfers the logic high presently at the data input of D flip flop 56 to the non-inverting output of D flip flop 56 thereby providing a logic low at one input of each AND gate 108, 110 and 112 (via inverter 62) and disabling any outputs of XOR gates 98, 106 and 100 with respect to output 46. In other words, the outputs of AND gates 108, 110 and 112 are always a logic low. Note that the inverting output of D flip flop 56 does not clock D flip flop 58 since it switched from a logic high state to a logic low state upon clocking D flip flop 56. Likewise, after a twelfth pulse occurs, the cycle of walking a logic "1" through a field of logic "0"s in PARITY VERIFY CIRCUIT 54 begins all over again with output C switching to a logic high and transferred to output 46 in a similar manner as aforedescribed (via OR gate 60). This is shown in FIG. 3 by the second output C pulse. However, on the thirteenth as well as the fourteenth clock pulses, the logic highs occurring at outputs D and E will not be transferred to output 46 because AND gates 108, 110 and 112 will not allow a logic high pulse to pass since each AND gate has a logic low at one of its inputs. In a similar manner, logic high pulses occurring at outputs F, I and L will be transferred to output 46 via OR gate 60, while the logic high pulses occurring at outputs G, H, J and K will not appear at output 46. Thus, the "verify parity" portion of the waveform of FIG. 3 has been generated. It is worth noting that at least one purpose of performing this second walking of a logic "1" through a field of logic "0"s in PARITY VERIFY CIRCUIT 54 is to verify that outputs C and L are operating properly. This is because if outputs C and/or L of PARITY VERIFY CIRCUIT 54 did not toggle high in response to the logic "1" walking therethrough, there would not be a change in the frequency at output 46 since the first logic high would just occur at output D and/or the last logic high would just occur at output K. Further, this second walking of a logic "1" through a field of logic "0"s in PARITY VERIFY CIRCUIT 54 provides a "characteristic frequency" that can be observed at output 46 by a typical frequency counter. Therefore, referring to FIG. 3 and assuming proper operation of array 42 and parity circuit 44, there should only be five rising edges (pulses) that occur per one total test period. These five pulses will correlate to a predetermined "characteristic frequency" to be observed at output 46. Therefore, when the frequency of the signal supplied at output 46 is substantially equal to a predetermined frequency, the logic circuit being tested has substantially zero defects occurring therein. However, if the frequency of the signal supplied at output 46 is greater than a predetermined frequency, then one or more defects have occurred within the logic circuit being tested.

It should then be realized that at the next succeeding clock pulse, the output (OUT) of PARITY VERIFY CIRCUIT 54 switches to a logic high which clocks D flip flop 56 and transfers the logic low presently at the data input of D flip flop 56 to the non-inverting output of D flip flop 56 thereby enabling AND gates 108, 110 and 112 (via inverter 62) to be responsive to the outputs of XOR gates 98, 106 and 100. In addition, the logic high appearing at the inverting output of D flip flop 56 clocks D flip flop 58 which provides a logic high at the non-inverting output of D flip flop 58 and resets D flip flop 64 (via OR gate 72) thereby taking ROW WALK CIRCUIT 48, COLUMN WALK CIRCUIT 50 and COUNTER 52 out of reset and placing PARITY VERIFY CIRCUIT 54 and D flip flops 56 and 58 back into reset. This resetting of D flip flop 64 is indicative of the logic circuit returning to the first mode of operation whereby the testing of array circuit 42 starts all over again.

Referring back to FIG. 3, the "verify matrix array" portion of the waveform is generated during the first mode of operation. This portion of the total test period is typically at a logic low for each clock pulse except when a logic high occurs at one of the inputs to either XOR gate 90, 92, 94, 96, 102 or 104 thereby signifying that a fault has occurred and has been detected within matrix arrays 74, 76, 78 or 80. Further, if no faults have occurred, no logic high pulses will occur during the "verify matrix array" period. However, for every fault that occurs, at least one logic high pulse will appear during the "verify matrix array" period thereby increasing the frequency of the waveform provided at output 46. It is worth noting that typically the "verify matrix array" time period of the waveform is substantially longer than the "verify parity" time period. This is especially true when testing large arrays (42) which is typically the case for current standard cells and gate arrays. As a result, even one logic high pulse occurring during "verify matrix array" can substantially increase the "characteristic frequency" of the waveform at output 46. It is worth noting that in a typical ASIC, ROW WALK CIRCUIT 48, COLUMN WALK CIRCUIT 50, COUNTER 52 and PARITY VERIFY CIRCUIT 54 occupy a substantially small portion of the integrated circuit as compared to the portion required by array 42. Therefore, incorporating ROW WALK CIRCUIT 48, COLUMN WALK CIRCUIT 50, COUNTER 52 and PARITY VERIFY CIRCUIT 54 (the support circuit necessary to test for reliability and functionality) is typically not a problem and proves to be quite effective.

Figure 4:
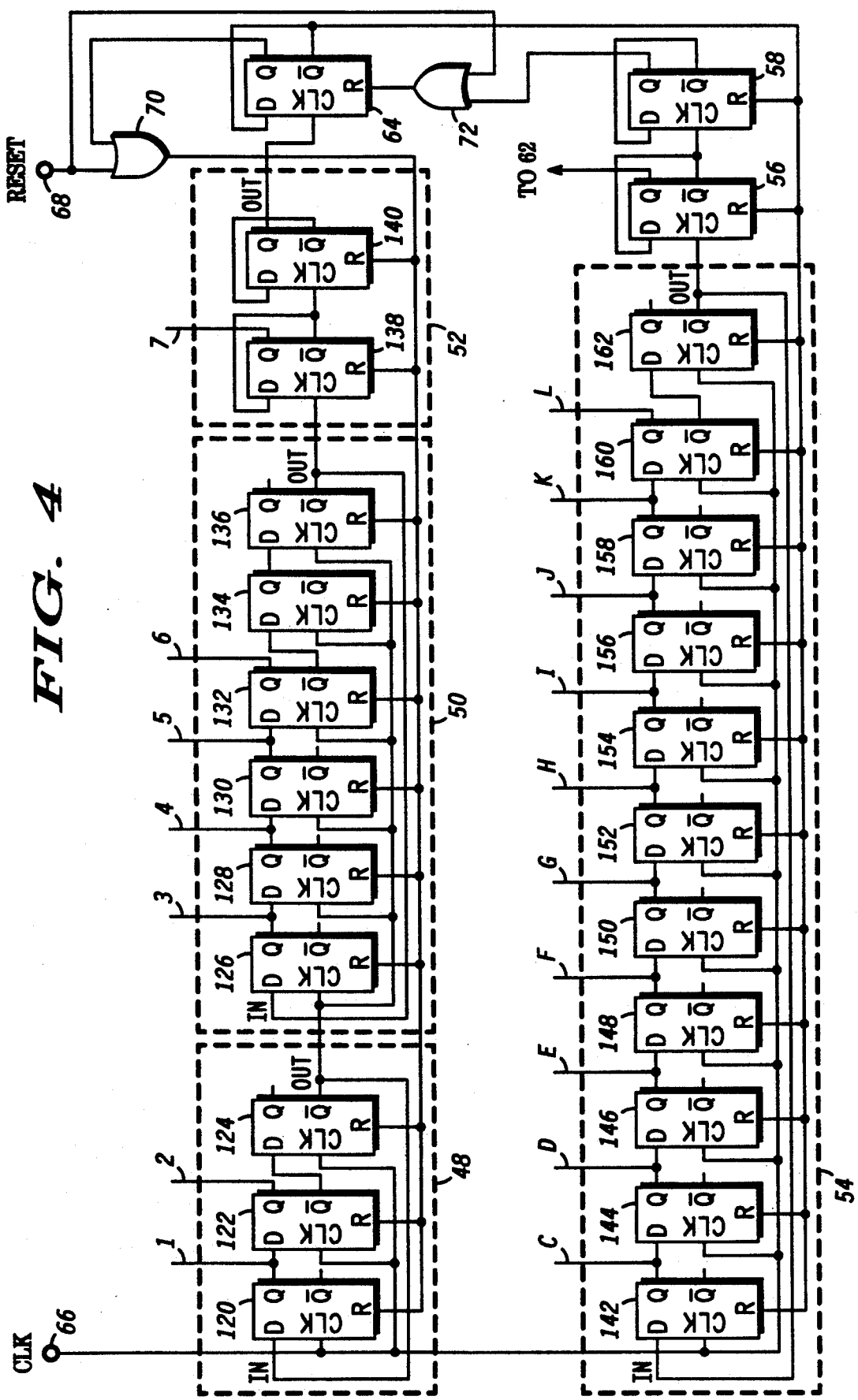
FIG. 4 is detailed schematic diagram illustrating various blocks shown in FIG. 2.

Referring to FIG. 4, a detailed schematic diagram illustrating various blocks shown in FIG. 2 is shown. It is understood that similar components to those in FIG. 2 are designated by the same reference numbers. Further, it should be understood that FIG. 4 represents just one possible implementation for ROW WALK CIRCUIT 48, COLUMN WALK CIRCUIT 50, COUNTER 52 and PARITY VERIFY CIRCUIT 54 wherein others exists.

ROW WALK CIRCUIT 48 includes D flip flops 120, 122 and 124 each having a clock input (CLK) coupled to terminal 66 and a reset input (R) coupled to the output of OR gate 70. Further, the data input of D flip flop 120 is coupled to an inverting output of D flip flop 124. A non-inverting output of D flip flop 120 provides signal 1 and is coupled to the data input of D flip flop 122. A non-inverting output of D flip flop 122 provides signal 2, while an inverting output of D flip flop 122 is coupled to the data input of D flip flop 124.

COLUMN WALK CIRCUIT 50 includes D flip flops 126, 128, 130, 132, 134 and 136 each having a reset input (R) coupled to the output of OR gate 70 and a clock input (CLK) coupled to the inverting output of D flip flop 124 of ROW WALK CIRCUIT 48. Further, the data input of D flip flop 126 is coupled to an inverting output of D flip flop 136. Non-inverting outputs of D flip flops 126, 128 and 130 respectively provide signals 3, 4 and 5 and are respectively coupled to the data input of D flip flops 128, 130 and 132. A non-inverting output of D flip flop 132 provides signal 6, while an inverting output of the same is coupled to the data input of D flip flop 134. A non-inverting output of D flip flop 134 is coupled to the data input of D flip flop 136.

COUNTER 52 includes D flip flops 138 and 140 each having a reset input (R) coupled to the output of OR gate 70. The clock input (CLK) of D flip flop 138 is coupled to the inverting output of D flip flop 136 of COLUMN WALK CIRCUIT 50, while the clock input (CLK) of D flip flop 140 is coupled to the inverting output of D flip flop 138. Both D flip flops 138 and 140 have their data inputs coupled to their respective inverting outputs. Further, the non-inverting output of D flip flop 138 provides signal 7, while the non-inverting output of D flip flop 140 is coupled to the clock input of D flip flop 64.

PARITY VERIFY CIRCUIT 54 includes D flip flops 142, 144, 146, 148, 150, 152, 154, 156, 158, 160 and 162 each having a reset input coupled to the inverting output of D flip flop 64 and a clock input coupled to terminal 66. Non-inverting outputs of D flip flops 142, 144, 146, 148, 150, 152, 154, 156 and 158 are respectively coupled to outputs C, D, E, F, G, H, I, J and K, and are respectively coupled to the data input of D flip flops 144, 146, 148, 150, 152, 154, 156, 158 and 160. A non-inverting output of D flip flop 160 is coupled to output L, while an inverting output of the same is coupled to the data input of D flip flop 162. An inverting output of D flip flop 162 is coupled to the data input of D flip flop 142 and to the clock input of D flip flop 56.

In operation, ROW WALK CIRCUIT 48, COLUMN WALK CIRCUIT 50 and COUNTER 52 which are operative during the first mode, provide signals 1-7 for exhaustively stimulating matrix arrays 74, 76, 78 and 80 with all possible logic combinations. Assuming start up from a circuit reset occurring at terminal 68, signals 1-7 are all at a logic low. After signal RESET applied to terminal 68 is returned to a logic low, ROW WALK CIRCUIT 48, COLUMN WALK CIRCUIT 50 and COUNTER 52 become enabled and the circuit is operating in a first mode.

ROW WALK CIRCUIT 48 functions to "walk" a logic "1" through a field of "0"s which appear at signals 1 and 2. After a first clock pulse occurring at terminal 66 since signal RESET became inactive, the logic "1" present at the data input of D flip flop 120 due the logic "1" present at the inverting output of D flip flop 124 is transferred to the non-inverting output of D flip flop 120 and also appears on signal 1. Further, this logic "1" is also now present at the data input of the next succeeding D flip flop (122). Note that the inverting output of D flip flop 124 is now at a logic "0" since the initial logic "1" present at the inverting output of D flip flop 122 was clocked therethrough thereby providing a logic "1" and "0" respectively at the non-inverting and inverting outputs of D flip flop 124. After a second clock pulse since signal RESET became inactive, the logic "1" occurring at the data input of D flip flop 122 is transferred to the non-inverting output of D flip flop 122 and also appears on signal 2. Further, the corresponding logic "0" present at the inverting output of D flip flop 122 is also now present at the data input of D flip flop 124. After a third clock pulse since signal RESET became inactive, the logic "0" occurring at the data input of D flip flop 124 results in providing a logic "1" to the inverting output of D flip flop 124 which returns back around to the data input of D flip flop 120. Further, the logic "1" occurring at the inverting output of D flip flop 124 functions to clock COLUMN WALK CIRCUIT 50. This aforedescribed operation of ROW WALK CIRCUIT 48 continues over again whereby a logic "1" is continuously "walked" through ROW WALK CIRCUIT 48 and appearing at signal 1 and then signal 2. It is worth noting that COLUMN WALK CIRCUIT 50 is clocked only when ROW WALK CIRCUIT 48 has completed a cycle of "walking" a logic "1" through signals 1 and 2.

COLUMN WALK CIRCUIT 50 functions to "walk" a pair of logic "1"s through a field of "0"s which appear at signals 3-6. The operation of COLUMN WALK CIRCUIT 50 is similar to the operation of ROW WALK CIRCUIT 48 with at least three exceptions. First, COLUMN WALK CIRCUIT 50 supplies four signals (signals 3-6) whereby ROW WALK CIRCUIT 48 supplies only two signals (signals 1-2). However, this difference is trivial and does not require any additional explanation. Second, COLUMN WALK CIRCUIT 50 is clocked by ROW WALK CIRCUIT 48 whereby ROW WALK CIRCUIT 48 is clocked by signal CLK applied to terminal 66. Third, COLUMN WALK CIRCUIT 50 includes D flip flops 134 and 136 which function to supply a pair of logic "1"s to be "walked" through COLUMN WALK CIRCUIT 50 whereby ROW WALK CIRCUIT 48 includes D flip flop 124 which functions to supply a logic "1" to be "walked" through ROW WALK CIRCUIT 48. D flip flops 134 and 136 are coupled together such that the initial logic "1" occurring at the inverting output of D flip flop 136 is first clocked into D flip flop 126, while the initial logic "0" occurring at the non-inverting output of D flip flop 134 is simultaneously clocked through D flip flop 136 thereby providing a logic "1" at the inverting output of D flip flop 136. Furthermore, on a subsequent clock pulse, the logic "1" present at the inverting output of D flip flop 136 as well as the data input of D flip flop 126 is transferred through D flip flop 126 thereby providing a pair of logic "1"s to be "walked" through COLUMN WALK CIRCUIT 50. Furthermore, for each completion of "walking" the pair of logic "1"s through COLUMN WALK CIRCUIT 50, the inverting output of D flip flop 136 transitions from a logic "0" to a logic "1" thereby clocking COUNTER 52. Likewise, it is worth noting that COUNTER 52 is clocked only when COLUMN WALK CIRCUIT 50 has completed a cycle of "walking" a pair logic "1"s through signals 3-6.

COUNTER 52 has at least two functions. First, COUNTER 52 simply provides a logic "1" or "0" to the SEL inputs of multiplexers 32 and 34 (of FIG. 1) via signal 7. For each clock of COUNTER 52 (by COLUMN WALK CIRCUIT 50), the non-inverting output of D flip flop 138 toggles from initially a logic "0" to a logic "1" and back to a logic "0" on the next clock as should be well known. Second, after two consecutive clock pulses to COUNTER 52, the non-inverting output of D flip flop 140 toggles from a logic "0" to a logic "1" thereby clocking D flip flop 64. The clocking of D flip flop 64 is indicative of the logic circuit entering the second mode of operation as aforementioned.

It should be realized by one of ordinary skill in the art that ROW WALK CIRCUIT 48, COLUMN WALK CIRCUIT 50 and COUNTER 52 provide a circuit to exhaustively stimulate the inputs of AND gates 14, 16, 18 and 20 via signals 1-7. This is so because before each clocking of COLUMN WALK CIRCUIT 50, ROW WALK CIRCUIT 48 must complete its cycle of "walking" of a logic "1" through signals 1-2. Further, COUNTER 52 provides signal 7 which provides a way to select between a predetermined row and a predetermined column output of matrix array 10 of FIG. 1.

In addition, PARITY VERIFY CIRCUIT 54 which is operative during the second mode, functions to "walk" a logic "1" through a field of logic "0"s which are initially present at outputs C-L of PARITY VERIFY CIRCUIT 54. In operation, after PARITY VERIFY CIRCUIT 54 has been taken out of reset (via D flip flop 64), outputs C-L are all at a logic low ("0") and the logic "1" present at the inverting output of D flip flop 162 is also present at the data input of D flip flop 142. Therefore, after PARITY VERIFY CIRCUIT 54 has been clocked for the first time since leaving the reset mode, the logic "1" occurring at the data input of D flip flop 142 is transferred to the non-inverting output of D flip flop 142 and also to output C of PARITY VERIFY CIRCUIT 54. Further, this logic "1" is also now present at the data input of the next succeeding D flip flop (144). Note that the inverting output of D flip flop 162 is now at a logic "0" since the initial logic "1" present at the inverting output of D flip flop 160 was clocked through thereby providing a logic "1" and "0" respectively at the non-inverting and inverting outputs of D flip flop 162. After a second clock pulse since leaving the reset mode, the logic "1" occurring at the data input of D flip flop 144 is transferred to the non-inverting output of D flip flop 144 and also to output D of PARITY VERIFY CIRCUIT 54. Further, this logic "1" is also now present at the data input of the next succeeding D flip flop (146). This process is continued through a tenth clock pulse whereby the logic "1" has "walked" through PARITY VERIFY CIRCUIT 54 to reach output L. However, after an eleventh clock pulse, the logic "0" present at the inverting output of D flip flop 160 is clocked through D flip flop 162 thereby providing a logic "1" at the inverting output of D flip flop 162 which serves at least two purposes. First, this logic low to logic high transition provides a clock pulse to D flip flop 56 which provides a logic "1" at the non-inverting output thereof which functions to disable the outputs of XOR gates 98, 106 and 100 with respect to output 46 as aforedescribed. Note that D flip flop 58 did not get clocked since the inverting output of D flip flop 56 transitioned from a logic high to a logic low. Second, this logic "1" resulting at the inverting output of D flip flop 162 also provides a new logic "1" at the data input of D flip flop 142. After a twelfth clock pulse since PARITY VERIFY CIRCUIT 54 has left the reset mode occurs, the logic "1" occurring at the data input of D flip flop 142 is again "walked" through PARITY VERIFY CIRCUIT 54 as aforedescribed. This process is again continued through a twenty-first clock pulse whereby the logic "1" has "walked" through PARITY VERIFY CIRCUIT 54 to reach output L. However, after a twenty-second clock pulse, the logic "0" present at the inverting output of D flip flop 160 is clocked through D flip flop 162 thereby providing a logic "0" at the non-inverting output of D flip flop 162 and a corresponding logic "1" at the inverting output of D flip flop 162. The logic "1" occurring at the inverting output of D flip flop 162 clocks D flip flop 56 which subsequently provides a logic "0" and a logic "1" respectively at the non-inverting and inverting outputs of D flip flop 56. The logic "0" occurring at the non-inverting output of D flip flop 56 functions to re-enable the outputs of XOR gates 98, 106 and 100 with respect to output 46 as aforedescribed. Further, the logic "1" occurring at the inverting output of D flip flop 56 clocks D flip flop 58 which subsequently provides a logic "1" at the non-inverting output of D flip flop 58 which resets D flip flop 64 via OR gate 72. This resetting of D flip flop 64 is indicative of the logic circuit returning to the first mode of operation as aforementioned.

By now it should be apparent from the foregoing discussion that a novel logic circuit has been provided for monitoring failures within an ASIC by observing the frequency of a single output signal.

We claim:

1. In an integrated circuit, a logic circuit for testing a reliability of the integrated circuit, comprising:

an array circuit including a plurality of matrix arrays each having a plurality of inputs, said plurality of matrix arrays being positioned in a predetermined row and column of said array circuit and being responsive to a plurality of input signals applied thereto for providing a respective row and column output;

a parity circuit responsive to said row and column outputs of said plurality of matrix arrays for causing an output signal at an output of the logic circuit to be in a first logic state whenever said row outputs of said plurality of matrix arrays are logically different, or whenever said column outputs of said plurality of matrix arrays are logically different;

stimulus means coupled to said plurality of inputs of said plurality of matrix arrays for supplying said plurality of input signals to exhaustively stimulate each one of said plurality of matrix arrays with all possible logic combinations; and verification means for verifying the operation of said parity circuit by stimulating said parity circuit with a predetermined logic sequence.

2. The logic circuit according to claim 1 further includes input buffer means coupled between said stimulus means and said array for supplying said plurality of input signals to said plurality of matrix arrays of said array circuit.

3. The logic circuit according to claim 2 wherein said parity circuit further includes means for verifying the functionality of said input buffer means such that a predetermined logic level signal is supplied at said output of the logic circuit whenever said input buffer means is defective.

4. The logic circuit according to claim 3 including mode control means having inputs coupled to said stimulus means and to said verification means for alternately rendering said stimulus means and said verification means operative.

5. The logic circuit according to claim 4 wherein each one of said plurality of matrix arrays of said array includes:

a plurality of gates being responsive to said plurality of input signals and being positioned in a predetermined row and column form, each said one of said plurality of gates providing a first and a second output;

a plurality of row OR gates coupled to said first outputs of said plurality of gates for providing a plurality of row outputs;

a plurality of column OR gates coupled to said second outputs of said plurality of gates for providing a plurality of column outputs;

row multiplexer means for selectively providing one of said plurality of row outputs of said plurality of row OR gates to said respective row output of said one of said plurality of matrix arrays; and column multiplexer means for selectively providing one of said plurality of column outputs of said plurality of column OR gates to said respective column output of said one of said plurality of matrix arrays.

6. The logic circuit according to claim 1 wherein defects occurring within said array circuit and said parity circuit are detected by a frequency of said output signal appearing at said output of the logic circuit.

* * * * *